United States Patent [19]
Ikeda et al.

[11] Patent Number: 5,960,159
[45] Date of Patent: Sep. 28, 1999

[54] HEAT TREATMENT OF SEMICONDUCTOR WAFERS WHERE UPPER HEATER DIRECTLY HEATS UPPER WAFER IN ITS ENTIRETY AND LOWER HEATER DIRECTLY HEATS LOWER WAFER IN ITS ENTIRETY

[75] Inventors: Fumihide Ikeda; Junichi Machida; Masayuki Tomita; Yasuhiro Inokuchi; Kazuhiro Shimeno; Hisashi Nomura; Tetsuaki Inada, all of Tokyo, Japan

[73] Assignee: Kokusai Electric Co., Ltd., Tokyo, Japan

[21] Appl. No.: 08/950,185

[22] Filed: Oct. 14, 1997

[51] Int. Cl.[6] ....................................... F26B 3/30
[52] U.S. Cl. .................... 392/418; 118/728; 118/724; 118/725; 392/416; 219/390; 219/405; 219/411
[58] Field of Search ..................... 219/390, 405, 219/411; 392/416, 418; 118/724, 725, 728, 50.1; 427/557, 559; 432/152

[56] References Cited

U.S. PATENT DOCUMENTS 5,414,244  5/1995  Imahashi ................................ 219/497

FOREIGN PATENT DOCUMENTS

| 60-211823 | 10/1985 | Japan | ..................................... 118/728 |
| 7094419 | 4/1995 | Japan . | |
| 816757 | 6/1996 | Japan . | |
| 8330238 | 12/1996 | Japan . | |
| 9008112 | 1/1997 | Japan . | |

*Primary Examiner*—Teresa Walberg
*Assistant Examiner*—Shawntina T. Fuqua

[57] ABSTRACT

A substrate processing apparatus includes a substrate supporting pedestal having an upper substrate supporting pedestal and a lower substrate supporting pedestal which are vertically stacked, an upper resistance heater provided above the upper substrate supporting pedestal so as to be opposite to the upper substrate supporting pedestal, and a lower resistance heater provided under the lower substrate supporting pedestal so as to be opposite to the lower substrate supporting pedestal. Each of the upper substrate supporting pedestal and the lower substrate supporting pedestal is capable of mounting a substrate or substrates in a substantially horizontal position, and the lower substrate supporting pedestal including an opening which exposes the substrate in its entirety or openings which expose the substrates in their entireties as viewed from under the lower substrate supporting pedestal.

20 Claims, 8 Drawing Sheets

FIG. 10
CONVENTIONAL ART ns. Among them, the present invention, still more par-
HEAT TREATMENT OF SEMICONDUCTOR WAFERS WHERE UPPER HEATER DIRECTLY HEATS UPPER WAFER IN ITS ENTIRETY AND LOWER HEATER DIRECTLY HEATS LOWER WAFER IN ITS ENTIRETY

BACKGROUND OF THE INVENTION

1. Field of the Invention

The present invention relates to a substrate processing apparatus and a substrate processing method, and more particularly, to an apparatus for processing substrates for manufacturing electronic components and a method for processing substrates for manufacturing electronic components. Among them, the present invention, still more particularly relates to an apparatus and a method for heat treatment of semiconductor wafers using resistance heaters.

2. Description of the Related Art

Figure 10:
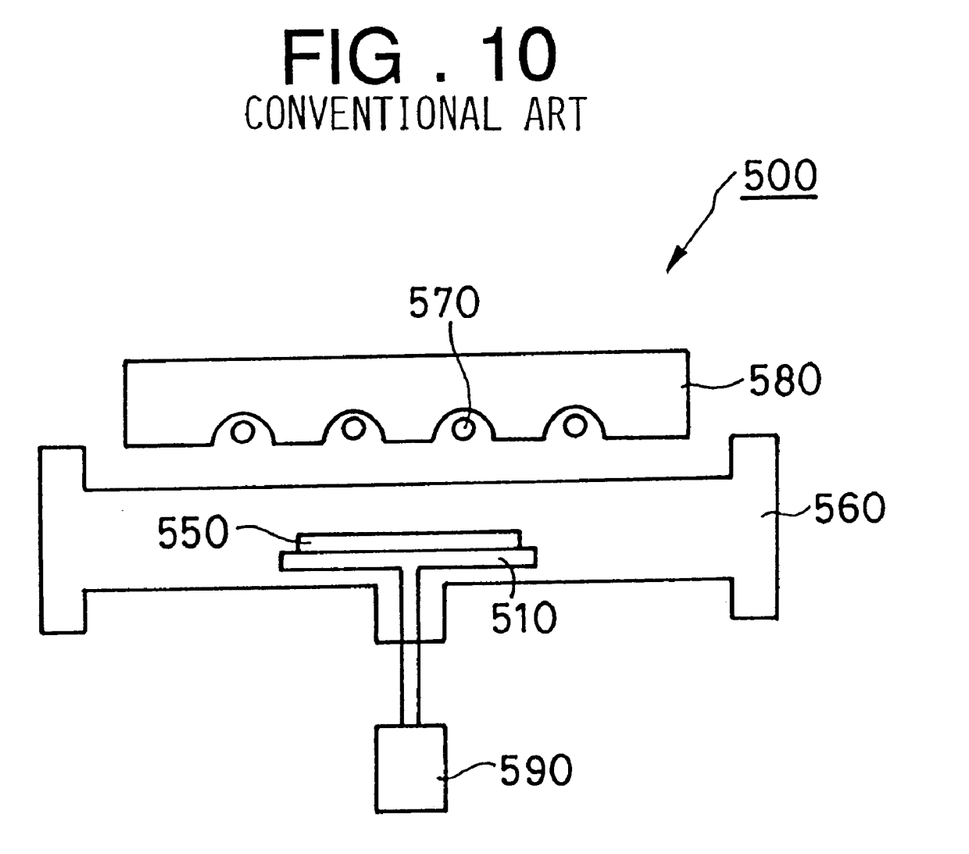
FIG. 10 is a cross sectional view for explaining a conventional semiconductor wafer processing apparatus.

As a method for heat treatment of wafers, there are a resistance heating method using a heater and a lamp heating method using a halogen lamp. As the method using the heater, a batch-type vertical furnace for simultaneously heating a hundred or more wafers is generally known. On the other hand, in the lamp heating method using the halogen lamp, wafers are processed one by one. FIG. 10 shows an apparatus for the lamp heating treatment using the lamp. A wafer 550 placed on a wafer pedestal 510 in a processing chamber 560 is heated by halogen lamps 570 accommodated in a lamp unit 580. In the lamp heating method, however, a wafer rotating mechanism 590 is required for uniformalizing a temperature distribution over a surface of the wafer 550. For this reason, the apparatus for the lamp heating method is mechanically complicated. Further, because the wafers are processed one by one in the lamp heating method, it is required to enhance the throughput.

SUMMARY OF THE INVENTION

It is, therefore, a major object of the present invention to provide a substrate processing apparatus which can achieve a high throughput with a relatively simple structure, and to provide a substrate processing method which can suitably be used for such an apparatus.

According to a first aspect of the present invention, there is provided a substrate processing apparatus, comprising:

a substrate supporting pedestal including an upper substrate supporting pedestal and a lower substrate supporting pedestal which are vertically stacked, each of the upper substrate supporting pedestal and the lower substrate supporting pedestal being capable of mounting a substrate or substrates in a substantially horizontal position, and the lower substrate supporting pedestal including a first opening which exposes the substrate in its entirety or first openings which expose the substrates in their entireties as viewed from under the lower substrate supporting pedestal;

an upper resistance heater provided above the upper substrate supporting pedestal so as to be opposite to the upper substrate supporting pedestal; and a lower resistance heater provided under the lower substrate supporting pedestal so as to be opposite to the lower substrate supporting pedestal.

According to a second aspect of the present invention, there is provided a substrate processing method, comprising the steps of:

placing two substrates in a state where the two substrates are vertically stacked and separate from each other between an upper resistance heater and a lower resistance heater; and processing the two substrates such that upper one of the substrates is directly heated in its entirety by the upper resistance heater, and lower one of the substrates is directly heated in its entirety by the lower resistance heater, in a state where the two substrates are vertically stacked and separate from each other between the upper resistance heater and the lower resistance heater.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

In order to improve the throughput, the present inventors have studied an apparatus in which two wafers are vertically stacked to simultaneously heat the wafers. However, with the above-described conventional lamp heating apparatus as shown in FIG. 10, because it is necessary to provide the wafer rotating mechanism 590 under the wafer 550, it is impossible to heat the wafer 550 through its lower surface. Therefore, it has been found out that it is impossible to uniformly heat the vertically stacked two wafers simultaneously.

Thereupon, in order to solve the problem that it is impossible to uniformly heat the vertically stacked two wafers simultaneously using the lamp heating method, the present inventors have invented an apparatus and a method in which the vertically stacked two wafers can be heated uniformally and simultaneously using a resistance heater.

Figure 1:
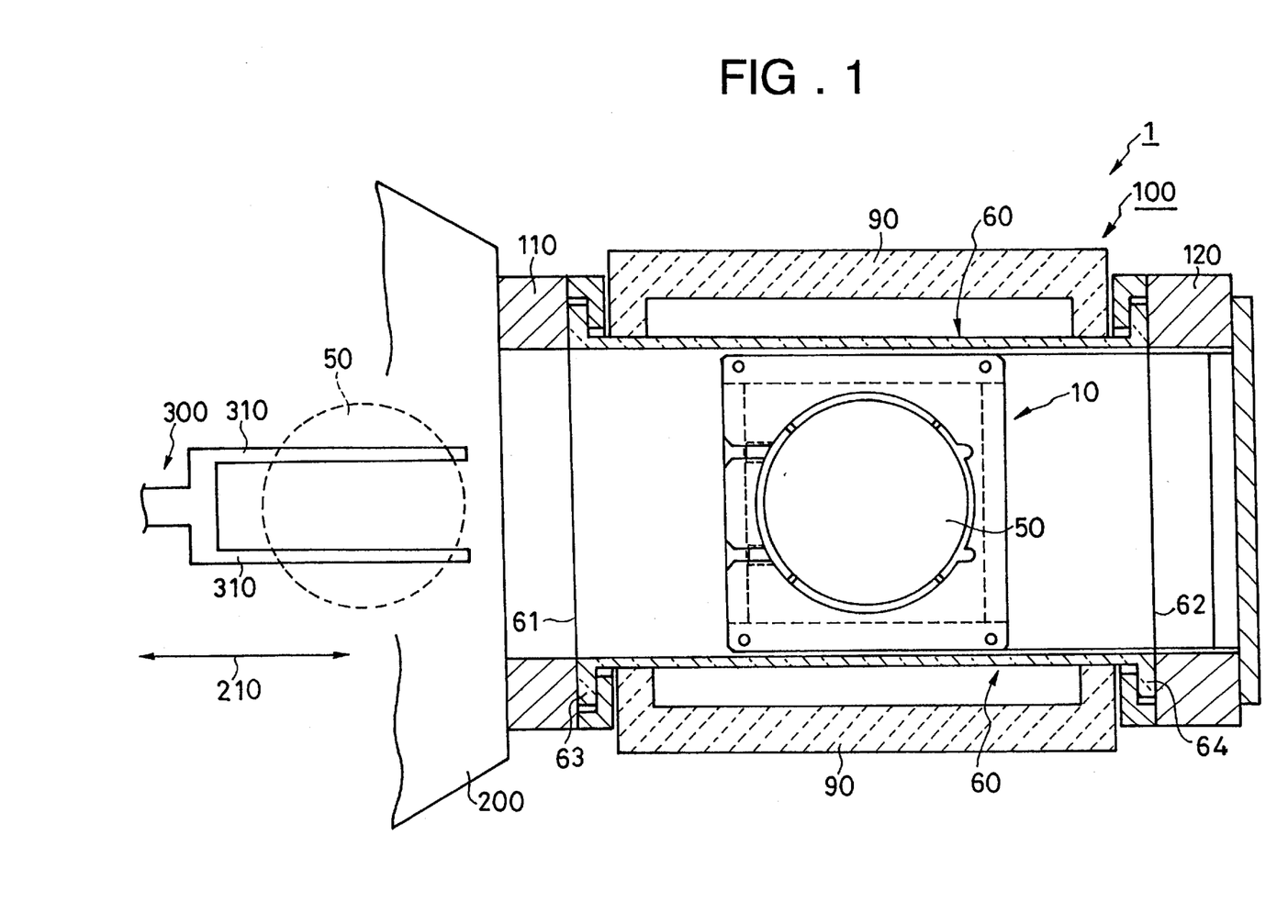
FIG. 1 is a transversal sectional view for explaining a semiconductor wafer processing apparatus according to first and second embodiments of the present invention.
Figure 2:
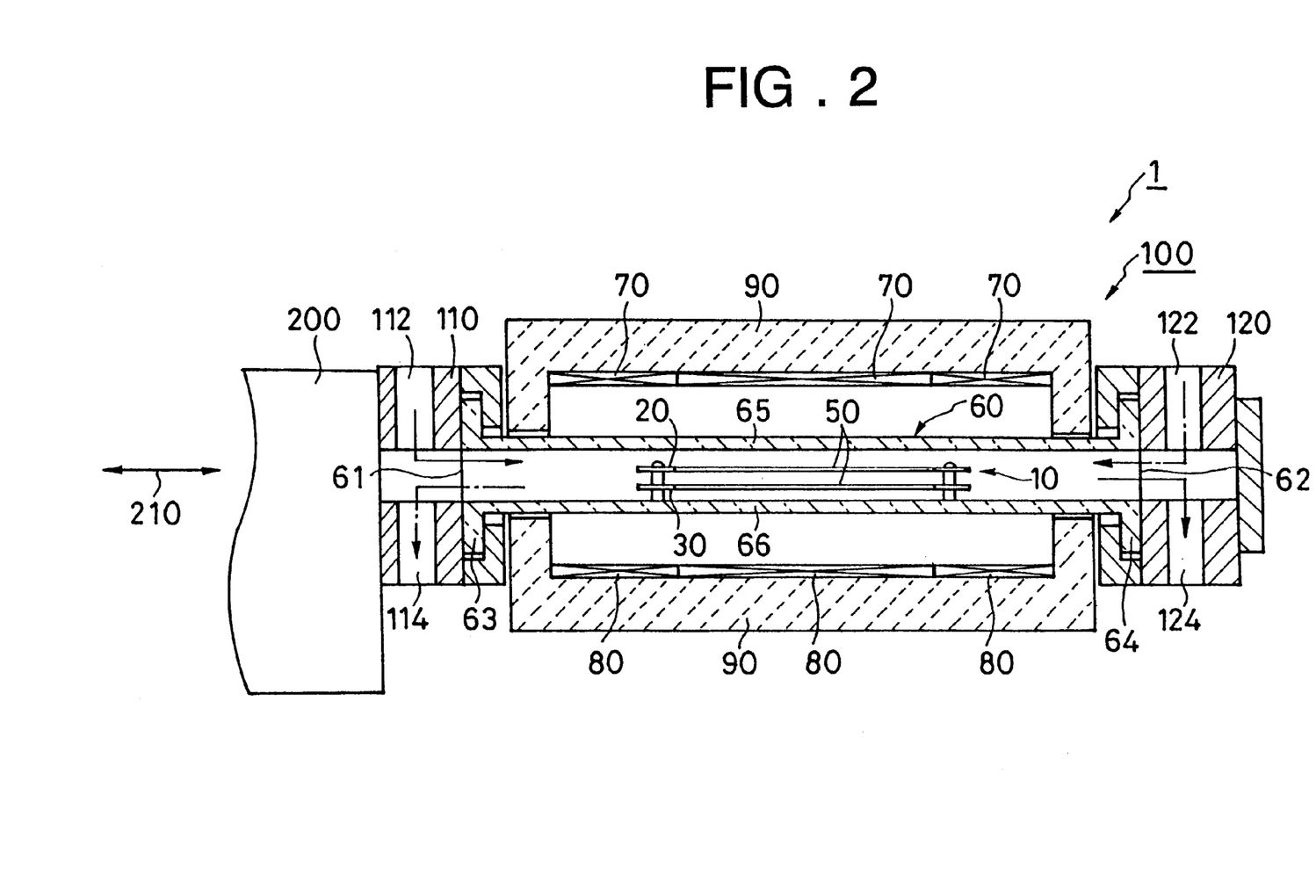
FIG. 2 is a longitudinal sectional view for explaining the semiconductor wafer processing apparatus according to the first and second embodiments of the present invention.

Referring to FIGS. 1 and 2, a substrate processing apparatus 1 according to first and second embodiments of the present invention includes a processing chamber 100 and a transfer chamber 200. The processing chamber 100 includes: a reaction tube 60 made of quartz; a wafer supporting pedestal 10 provided in the reaction tube 60; an upper heater 70 and a lower heater 80 respectively provided above and under the reaction tube 60; a heat insulation material 90 provided so as to cover the upper heater 70, the lower heater 80 and the reaction tube 60; and flanges 110 and 120 respectively provided at left-hand and right-hand sides of the reaction tube 60.

The reaction tube 60 is of a rectangular parallelepiped shape, and its left and right flanges 63 and 64 are respectively attached to the flanges 110 and 120. The flange 110 is provided with a gas supply port 112 and an exhaust port 114, and the flange 120 is provided with a gas supply port 122 and an exhaust port 124. An upper surface 65 and a lower surface 66 of the reaction tube 60 are disposed in a substantially horizontal direction. A gas flows in the reaction tube 60 substantially in parallel with the upper surface 65 and the lower surface 66 of the reaction tube 60.

A transfer chamber 200 is mounted to the processing chamber 100 through the flange 110. A transfer robot (not shown) for transferring the wafer is provided in the transfer chamber 200. The transfer robot includes a wafer transfer arm 300 for mounting the wafer 50, and transfers the wafer 50 in a direction shown by an arrow 210.

Two wafers 50 are vertically stacked at a distance from each other by the wafer supporting pedestal 10 such that upper and lower surfaces of each of the two wafers 50 are disposed horizontally.

Figure 3:
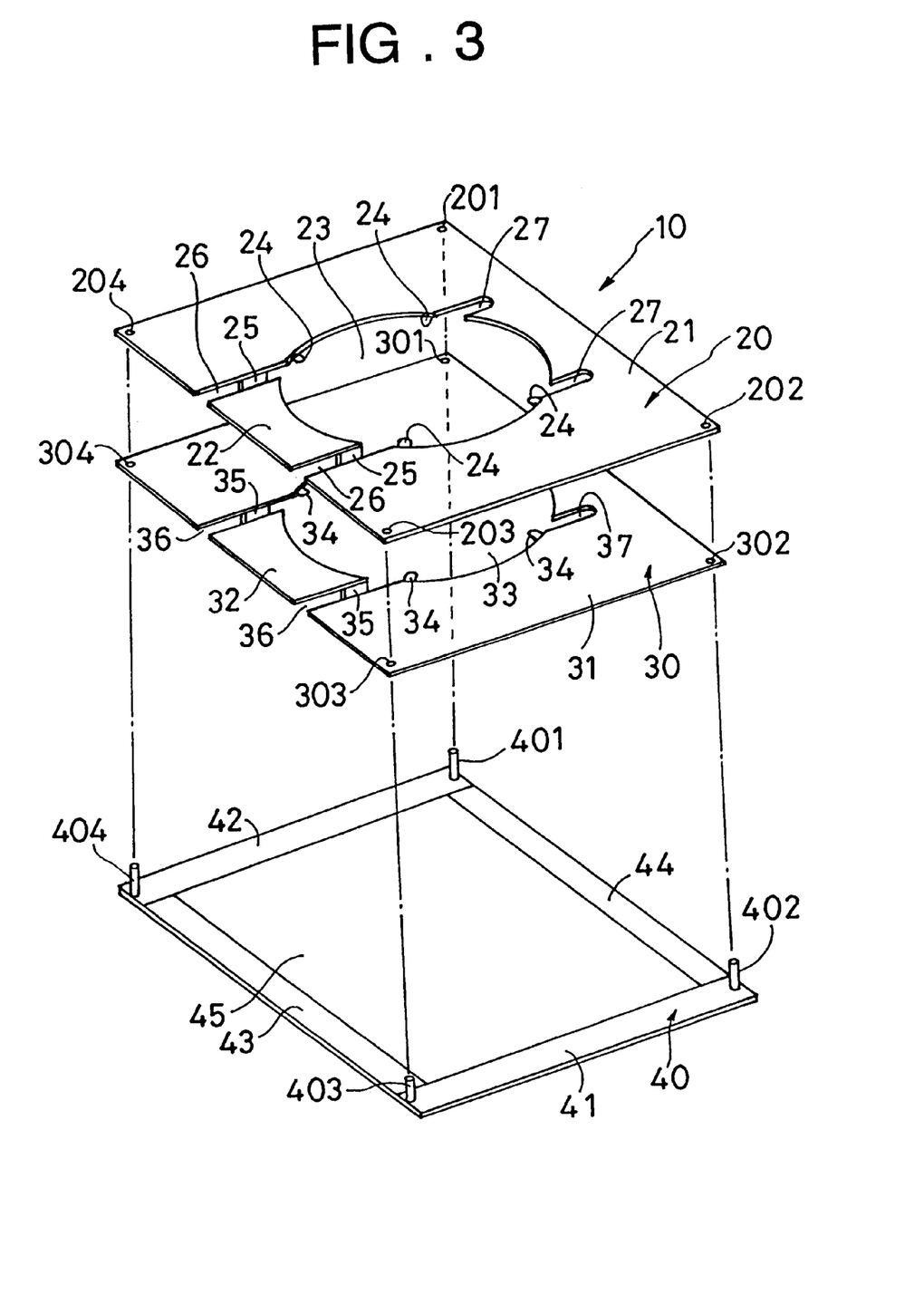
FIG. 3 is an exploded perspective view for explaining a wafer supporting pedestal used in the semiconductor wafer processing apparatus according to the first embodiments of the present invention.
Figure 4:
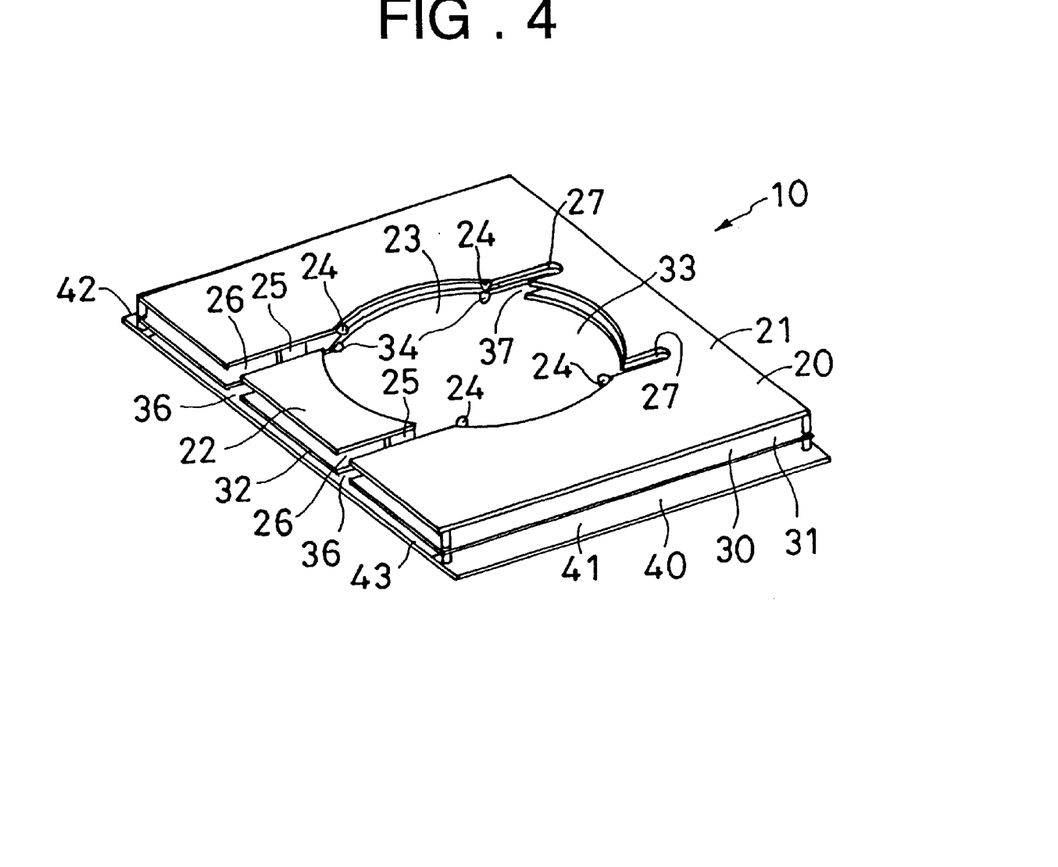
FIG. 4 is a perspective view for explaining the wafer supporting pedestal used in the semiconductor wafer processing apparatus according to the first embodiments of the present invention.

As shown in FIGS. 3 and 4, the wafer supporting pedestal 10 according to the first embodiment of the present invention comprises a base portion 40, a lower wafer supporting pedestal 30 and an upper wafer supporting pedestal 20, all of which are stacked from below to above in this order. Each of the base portion 40, the lower wafer supporting pedestal 30 and the upper wafer supporting pedestal 20 is made of quartz, alumina or the like.

The base portion 40 is substantially rectangular in shape as viewed on a plane, and comprises four frame members 41 to 44 disposed at four sides of the rectangle. The inside of the four frame members 41 to 44 forms a rectangular opening 45. The opening 45 is larger than openings 23 and 33 which will be described later. The frame member 41 on the front side as viewed in FIGS. 3 and 4 is provided at its both sides with pins 402 and 403, respectively, and the frame member 42 on the back side is provided at its both sides with pins 401 and 404, respectively. The lower wafer supporting pedestal 30 is provided at its four corners with holes 301 to 304, respectively, and the upper wafer supporting pedestal 20 is provided at its four corners with holes 201 to 204, respectively. The pin 401 is inserted into the holes 301 and 201, the pin 402 is inserted into the holes 302 and 202, the pin 403 is inserted into the holes 303 and 203, and the pin 404 is inserted into the holes 304 and 204, thereby stacking and unifying the base portion 40, the lower wafer supporting pedestal 30 and the upper wafer supporting pedestal 20.

Taking the case of the upper wafer supporting pedestal 20, its structure will be described. Because the structure of the lower wafer supporting pedestal 30 is the same as that of the upper wafer supporting pedestal 20, elements of the lower wafer supporting pedestal 30 which correspond to those of the upper wafer supporting pedestal 20 will only be indicated with reference numerals put in brackets immediately after reference numerals of the upper wafer supporting pedestal 20, and descriptions of the elements of the lower wafer supporting pedestal 30 will be omitted.

The upper wafer supporting pedestal 20 (the lower wafer supporting pedestal 30) is rectangular in shape as viewed on a plane, and includes a wafer supporting plate 21 (31) and an auxiliary plate 22 (32). An opening 23 (33) is defined inside the wafer supporting plate 21 (31) and the auxiliary plate 22 (32). The opening 23 (33) is circular in shape having a diameter slightly larger than that of the wafer 50. Therefore, when the wafer 50 is mounted, when the upper wafer supporting pedestal 20 (the lower wafer supporting pedestal 30) is seen from below, the wafer 50 is entirely exposed through the opening 23 (33). The wafer supporting plate 21 (31) is provided with four claws 24 (34) projected inward of the opening 23 (33). The four claws 24 (34) are disposed so as to support a periphery of the wafer 50 at intervals of 90 degrees from one another. The claws 24 (34) are provided such that when the wafer 50 is mounted on the claws 24 (34), an upper surface of the wafer 50, an upper surface of the wafer supporting plate 21 (31) and an upper surface of the auxiliary plate 22 (32) are flush with one another on the same plane.

Figure 7:
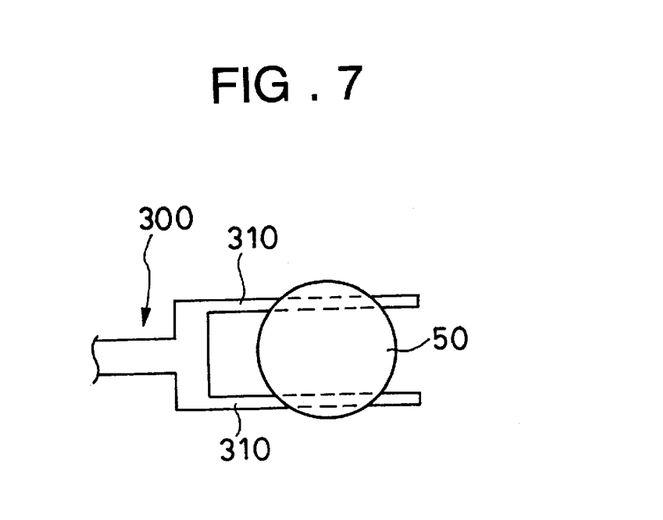
FIG. 7 is a plan view for explaining a wafer transfer arm used in the semiconductor wafer processing apparatus according to the first and second embodiments of the present invention.

As shown in FIGS. 1 and 7, the wafer 50 is transferred to the wafer supporting pedestal 10 in a state where the wafer 50 is mounted on two straight mounting arms 310 and 310 provided at a tip end of the wafer transfer arm 300. Then, the wafer 50 is transferred onto the upper wafer supporting pedestal 20 or the lower wafer supporting pedestal 30, or is inversely transferred, from the upper wafer supporting pedestal 20 or the lower wafer supporting pedestal 30, onto the mounting arms 310 and 310, and is transferred out. At that time, in order to make it possible to transfer the wafer 50 between the upper wafer supporting pedestal 20 (the lower wafer supporting pedestal 30) and the wafer transfer arm 300, the upper wafer supporting pedestal 20 (the lower wafer supporting pedestal 30) is provided with notched portions 27 (37) and gaps 26 (36) into which the mounting arms 310 are to be inserted and vertically moved. The notched portions 27 (37) are formed in the wafer supporting plate 21 (31), and the gaps 26 (36) are formed between the wafer supporting plate 21 (31) and the auxiliary plate 22 (32).

Figure 5:
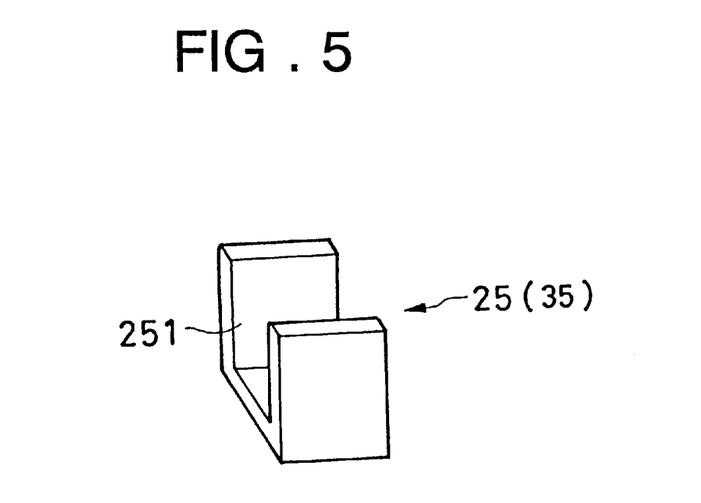
FIG. 5 is a perspective view for explaining a connection member used in the wafer supporting pedestal of the semiconductor wafer processing apparatus according to the first and second embodiments of the present invention.

Although the wafer 50 can be supported and transferred without providing the auxiliary plate 22 (32), because the gas flows substantially in parallel to an upper surface of the wafer 50, the gas is made to flow above the upper surface of the wafer 50 more uniformly by providing the auxiliary plate 22 (32). The auxiliary plate 22 (32) is connected to the wafer supporting plate 21 (31) by use of connection members 25. Each of the connection members 25 (35) has the structure as shown in FIG. 5. The connection members 25 (35) are provided at their central portions with spaces 251 through which the mounting arms 310 of the wafer transfer arm 300 can pass so that the interference between the mounting arms 310 and the connection members 25 (35) is prevented from occurring.

Figure 6:
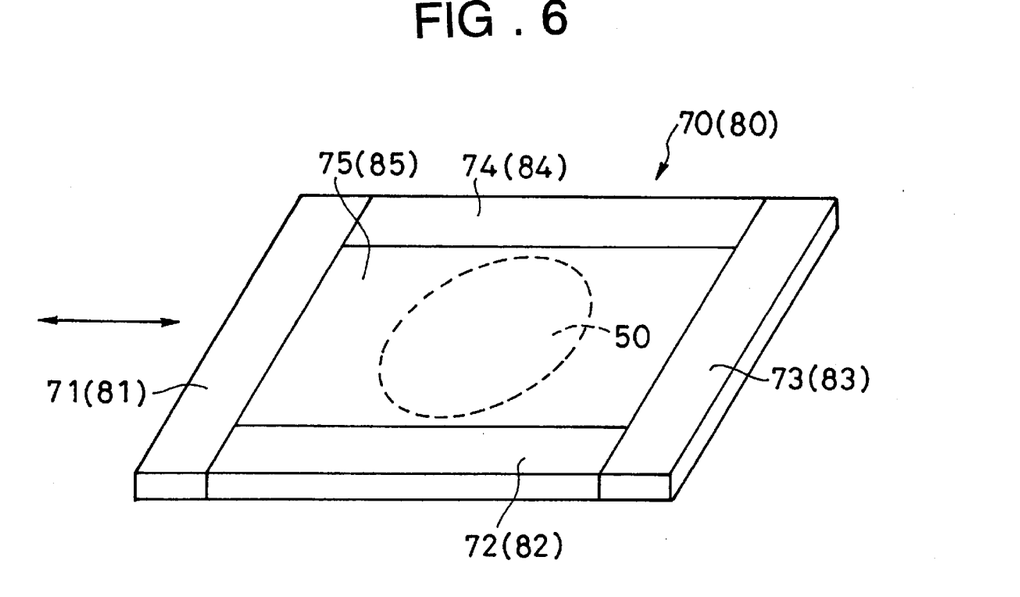
FIG. 6 is a perspective view for explaining a resistance heater of the semiconductor wafer processing apparatus according to the first and second embodiments of the present invention.

The wafer 50 is heated by the upper heater 70 or the lower heater 80. Each of the upper heater 70 and the lower heater 80 is divided into five pieces in a horizontal direction as shown in FIG. 6. The upper heater 70 comprises auxiliary heaters 71 to 75, and the lower heater 80 comprises auxiliary heaters 81 to 85. The wafer 50 is designed to be positioned within a range of the central auxiliary heater 75 (85) as viewed on a plane. The auxiliary heaters 71 to 75 (the auxiliary heaters 81 to 85) are designed such that they can be controlled independently of each other, so that the distribution of temperature over the surface of the wafer 50 can easily be uniformed. The upper heater 70 and the lower heater 80 are resistance heaters. At the time of heating treatment, a gas flows in a lateral direction as shown by the arrow in FIG. 6.

The wafer 50 is transferred above the opening 23 of the upper wafer supporting pedestal 20 by the wafer transfer arm 300 in a state where the wafer 50 is mounted on the mounting arms 310 of the wafer transfer arm 300. Then, the wafer 50 is mounted onto the claws 24 by lowering the wafer transfer arm 300. Another wafer 50 is also mounted onto the lower wafer supporting pedestal 30 in the same manner.

The two wafers 50 each mounted on the upper wafer supporting pedestal 20 and the lower wafer supporting pedestal 30 are respectively heated by the upper heater 70 and the lower heater 80. At that time, a raw material gas is made to flow substantially in a horizontal direction in the reaction tube 60. More specifically, the raw material gas is first made to flow into the reaction tube 60 from the gas supply port 112 through the opening 61 of the reaction tube 60, and is discharged from the exhaust port 124 of the flange 120 through the opening 62 of the reaction tube 60 and then, the raw material gas is made to flow into the reaction tube 60 from the gas supply port 122 of the flange 120 through the opening 62 of the reaction tube 60, and is discharged from the exhaust port 114 of the flange 110 through the opening 61 of the reaction tube 60. The flow of the raw gas is thus switched over in the middle of a certain process (e.g., a film formation process).

When a process such as the film formation process is completed, the mounting arms 310 of the wafer transfer arm 300 are positioned under the upper wafer 50 which is mounted on the claws 24 of the upper wafer supporting pedestal 20. Thereafter, the wafer 50 is mounted onto the mounting arms 310 by lifting up the mounting arms 310 and then, the wafer 50 is transferred out from the processing chamber 100 by returning the wafer transfer arm 300 leftward. The lower wafer 50 mounted on the lower wafer supporting pedestal 30 is also transferred out in the same manner.

In the present embodiment, the wafer 50 mounted on the upper wafer supporting pedestal 20 and the wafer 50 mounted on the lower wafer supporting pedestal 30 are separately heated by the upper heater 70 and the lower heater 80, respectively. Therefore, it is possible to simultaneously heat both the wafers 50 mounted on the upper wafer supporting pedestal 20 and the lower wafer supporting pedestal 30 and thus, the processing efficiency and the throughput are enhanced.

Because the lower wafer supporting pedestal 30 is provided with the opening 33 which exposes the wafer 50 entirely, the lower wafer 50 mounted on the lower wafer supporting pedestal 30 is entirely heated directly by the lower heater 80. On the other hand, the upper wafer 50 mounted on the upper wafer supporting pedestal 20 is directly heated by the upper heater 70. As a result, the upper wafer 50 mounted on the upper wafer supporting pedestal 20 is entirely heated uniformly by the upper heater 70, and the lower wafer 50 mounted on the lower wafer supporting pedestal 30 is entirely heated uniformly by the lower heater 80. Further, the heating treatment of the upper wafer 50 mounted on the upper wafer supporting pedestal 20 by the upper heater 70 and the heating treatment of the lower wafer 50 mounted on the lower wafer supporting pedestal 30 by the lower heater 80 can be conducted under substantially the same conditions. Therefore, such a heating treatment of the upper wafer 50 mounted on the upper wafer supporting pedestal 20 and such a heating treatment of the lower wafer 50 mounted on the lower wafer supporting pedestal 30 can be conducted equally and thus, treatments such as the film formation treatments can also be conducted equally. Furthermore, in the present embodiment, because the upper wafer supporting pedestal 20 is also provided with the opening 23 which exposes the upper wafer 50 entirely, the upper wafer 50 mounted on the upper wafer supporting pedestal 20 is heated more uniformly, and the heating treatment of the upper wafer 50 mounted on the upper wafer supporting pedestal 20 and the heating treatment of the lower wafer 50 mounted on the lower wafer supporting pedestal 30 can be conducted more equally.

Further, because the upper heater 70 and the lower heater 80 are resistance heaters, it is unnecessary to provide a mechanism such as a rotating mechanism for uniformly heating the wafer 50, which contributes to simplify the structure of the apparatus.

Figure 8:
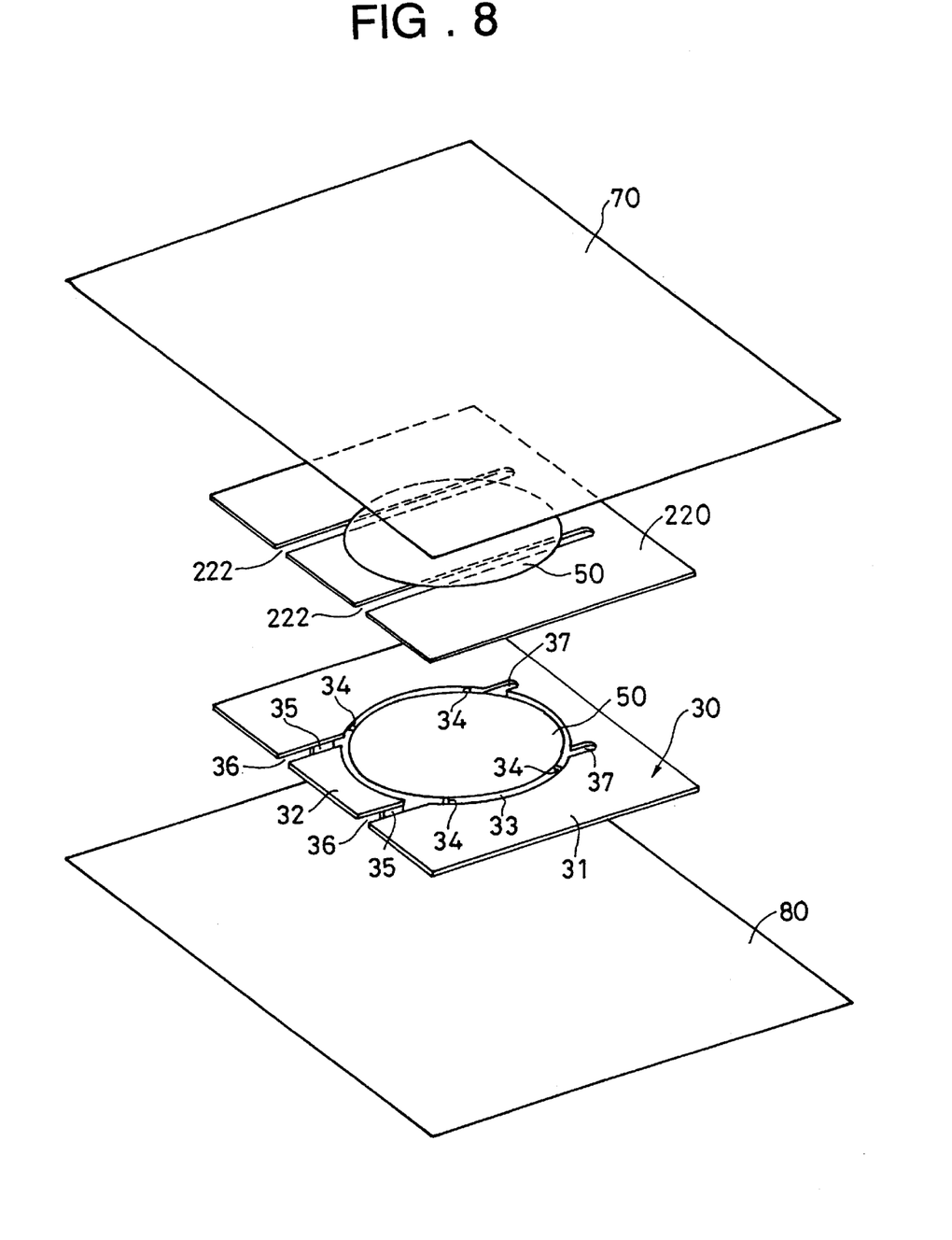
FIG. 8 is a perspective view for explaining a semiconductor wafer processing apparatus according to the second embodiment of the present invention.

FIG. 8 shows a second embodiment of the present embodiment. In the second embodiment, the same lower wafer supporting pedestal 30 as in the first embodiment is used. However, an upper wafer supporting pedestal 220 is not provided with the opening 23 which is provided in the upper wafer supporting pedestal 20 of the first embodiment, but is provide with only straight notched portions 222 so that the mounting arms 310 (see FIGS. 1 and 7) of the wafer transfer arm 300 do not interfere with the upper wafer supporting pedestal 220. Even with this structure, because there is no obstacle between the upper heater 70 and the upper wafer 50 mounted on the upper wafer supporting pedestal 20, the upper wafer 50 is directly heated by the upper heater 70. Further, the lower wafer 50 mounted on the lower wafer supporting pedestal 30 is entirely exposed through the opening 33, and the lower wafer 50 is also directly heated by the lower heater 80. Therefore, the heating treatment of the upper wafer 50 mounted on the upper wafer supporting pedestal 220 by the upper heater 70 and the heating treatment of the lower wafer 50 mounted on the lower wafer supporting pedestal 30 by the lower heater 80 can be conducted under substantially the same conditions. Therefore, such a heating treatment of the upper wafer 50 mounted on the upper wafer supporting pedestal 220 and such a heating treatment of the lower wafer 50 mounted on the lower wafer supporting pedestal 30 can be conducted equally and thus, treatments such as the film formation can also be conducted equally. However, the heating treatment of the wafer 50 mounted on the upper wafer supporting pedestal and the heating treatment of the wafer 50 mounted on the lower wafer supporting pedestal can be conducted more equally in the first embodiment in which the upper wafer supporting pedestal 20 is also provided with the opening 23 which entirely exposes the wafer 50 like the opening 33 provided in the lower wafer supporting pedestal 30, as compared with the second embodiment which uses the above-described upper wafer supporting pedestal 220.

Figure 9:
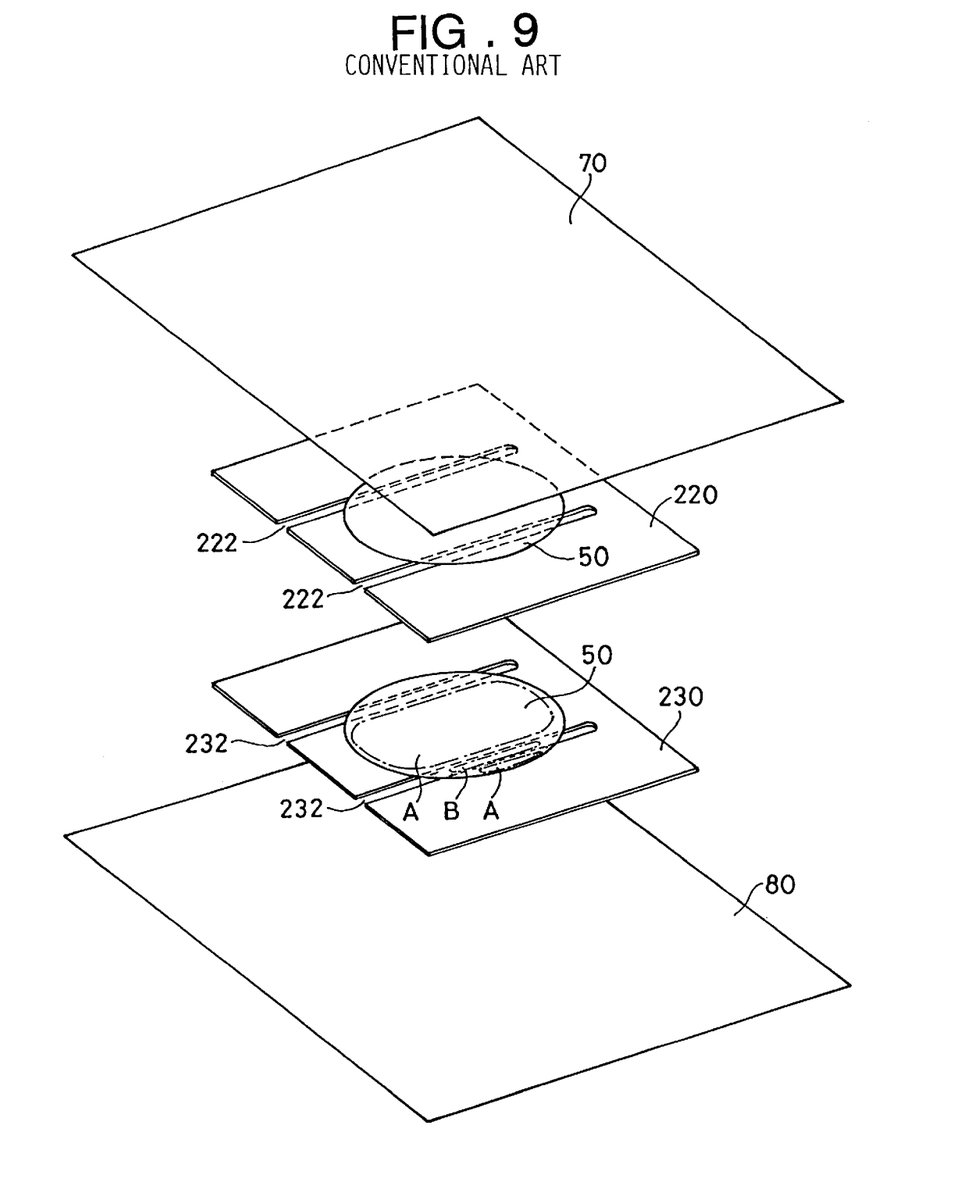
FIG. 9 is a perspective view for explaining a semiconductor wafer processing apparatus for comparison.

FIG. 9 is a perspective view for explaining a semiconductor wafer processing apparatus for comparison. In this case, both the upper wafer supporting pedestal 220 and a lower wafer supporting pedestal 230 are respectively provided with only straight notched portions 222 and 232 so that the mounting arms 310 (see FIGS. 1 and 7) of the wafer transfer arm 300 do not interfere with the upper wafer supporting pedestal 220 and the lower wafer supporting pedestal 230, respectively. In the case of this structure, because there is no obstacle between the upper heater 70 and the upper wafer 50 mounted on the upper wafer supporting pedestal 220, the upper wafer 50 is directly heated by the upper heater 70. However, although the lower wafer 50 mounted on the lower wafer supporting pedestal 230 is heated mainly by the lower heater 80 (because the upper wafer 50 obstructs the heat from the upper heater 70), the lower wafer supporting pedestal 230 exists between the lower heater 80 and the lower wafer 50. Therefore, in this case, the wafer 50 is not heated uniformly between its portions A (which exist on the lower wafer supporting pedestal 230 as shown in FIG. 9) and its portions B (which exist above the notched portions 232 and is directly heated by the lower heater 80 because the lower wafer supporting pedestal 230 does not exist thereunder). Therefore, the heating treatment is not conducted uniformly and as a result, the film thickness or the like becomes nonuniform. It is required to control such a nonuniform heating treatment more strictly with the progress of highly integrated circuit. Further, it is difficult to conduct the heating treatment of the upper wafer 50 mounted on the upper wafer supporting pedestal 220 by the upper heater 70 and the heating treatment of the lower wafer 50 mounted on the lower wafer supporting pedestal 230 by the lower heater 80 under the same condition, and such a heating treatment of the upper wafer 50 mounted on the upper wafer supporting pedestal 220 and such a heating treatment of the lower wafer 50 mounted on the lower wafer supporting pedestal 230 are conducted unequally and thus, treatments such as the film formation are also conducted unequally.

As described above, although the opening 23 of the upper wafer supporting pedestal 20 and the opening 33 of the lower wafer supporting pedestal 30 are preferably hollowed out circularly into circle shapes which is substantially the same as the wafer, they may be hollowed out into polygonal shapes the size of which is larger than that of the semiconductor wafer, of course.

Further, the above description has been made taking the case of the semiconductor wafer, the present invention can be suitably applied to a glass substrate for manufacturing a liquid crystal display device and the like.

What is claimed is:

1. A substrate processing apparatus, comprising:

substrate supporting pedestal including an upper substrate supporting pedestal and a lower substrate supporting pedestal which are vertically stacked, each of said upper substrate supporting pedestal and said lower substrate supporting pedestal for mounting at least one substrate in a substantially horizontal position, and said lower substrate supporting pedestal including at least one first opening which exposes said substrate mounted to the lower substrate supporting pedestal in its entirety as viewed from under the lower substrate supporting pedestal;

an upper resistance heater provided above said upper substrate supporting pedestal so as to be opposite to said upper substrate supporting pedestal and to directly heat in its entirety the substrate mounted to the upper substrate supporting pedestal; and a lower resistance heater provided under said lower substrate supporting pedestal so as to be opposite to said lower substrate supporting pedestal and to directly heat in its entirety the substrate mounted to the lower substrate supporting pedestal.

2. A substrate processing apparatus as recited in claim 1, wherein the at least one substrate each of said upper substrate supporting pedestal and said lower substrate supporting pedestal mounts is one, and the number of said at least one first opening is one.

3. A substrate processing apparatus as recited in claim 1, wherein said upper substrate supporting pedestal includes at least one second opening which exposes said at least one substrate in its entirety as viewed from under the upper substrate supporting pedestal.

4. A substrate processing apparatus as recited in claim 2, wherein said upper substrate supporting pedestal includes a second opening which exposes said substrate in its entirety as viewed from under the upper substrate supporting pedestal.

5. A substrate processing apparatus as recited in claim 1, wherein said at least one substrate is a semiconductor wafer.

6. A substrate processing apparatus as recited in claim 2, wherein said substrate is a semiconductor wafer.

7. A substrate processing apparatus as recited in claim 3, wherein said at least one substrate is a semiconductor wafer.

8. A substrate processing apparatus as recited in claim 1, wherein said at least one substrate is a semiconductor wafer, and said at least one first opening is substantially circular in shape and slightly larger than said semiconductor wafer.

9. A substrate processing apparatus as recited in claim 2, wherein said substrate is a semiconductor wafer, and said first opening is substantially circular in shape, and is slightly larger than said semiconductor wafer.

10. A substrate processing apparatus as recited in claim 3, wherein, said at least one substrate is a semiconductor wafer, and each of said first and second openings is substantially circular in shape and slightly larger than said semiconductor wafer.

11. A substrate processing apparatus as recited in claim 1, further comprising a reaction tube, wherein said substrate supporting pedestal is provided in said reaction tube, and said upper and lower resistance heaters are provided outside said reaction tube.

12. A substrate processing apparatus as recited in claim 2, further comprising a reaction tube, wherein said substrate supporting pedestal is provided in said reaction tube, and said upper and lower resistance heaters are provided outside said reaction tube.

13. A substrate processing apparatus as recited in claim 3, further comprising a reaction tube, wherein said substrate supporting pedestal is provided in said reaction tube, and said upper and lower resistance heaters are provided outside said reaction tube.

14. A substrate processing apparatus as recited in claim 11, wherein an upper surface of said upper substrate supporting pedestal is substantially horizontal, an upper surface of said lower substrate supporting pedestal is substantially horizontal, said upper substrate supporting pedestal is capable of mounting said at least one substrate such that a main upper surface of said at least one substrate lies in a plane which is substantially the same as said upper surface of said upper substrate supporting pedestal, said lower substrate supporting pedestal is capable of mounting said at least one substrate such that a main upper surface of said at least one substrate lies in a plane which is substantially the same as said upper surface of said lower substrate supporting pedestal, and a gas can be flowed in said reaction tube in a substantially horizontal direction.

15. A substrate processing apparatus as recited in claim 12, wherein
an upper surface of said upper substrate supporting pedestal is substantially horizontal,
an upper surface of said lower substrate supporting pedestal is substantially horizontal,
said upper substrate supporting pedestal is capable of mounting said substrate such that a main upper surface of said substrate lies in a plane which is substantially the same as said upper surface of said upper substrate supporting pedestal,
said lower substrate supporting pedestal is capable of mounting said substrate such that a main upper surface of said substrate lies in a plane which is substantially the same as said upper surface of said lower substrate supporting pedestal, and
a gas can be flowed in said reaction tube in a substantially horizontal direction.

16. A substrate processing apparatus as recited in claim 13, wherein
an upper surface of said upper substrate supporting pedestal is substantially horizontal,
an upper surface of said lower substrate supporting pedestal is substantially horizontal,
said upper substrate supporting pedestal is capable of mounting said at least one substrate such that a main upper surface of said at least one substrate lies in a plane which is substantially the same as said upper surface of said upper substrate supporting pedestal,
said lower substrate supporting pedestal is capable of mounting said at least one substrate such that a main upper surface of said at least one substrate lies in a plane which is substantially the same as said upper surface of said lower substrate supporting pedestal, and
a gas can be flowed in said reaction tube in a substantially horizontal direction.

17. A substrate processing method, comprising the steps of:
placing two substrates in a state where said two substrates are vertically stacked and separate from each other between an upper resistance heater and a lower resistance heater; and
processing said two substrates such that upper one of said substrates is directly heated in its entirety by said upper resistance heater, and lower one of said substrates is directly heated in its entirety by said lower resistance heater, in a state where said two substrates are vertically stacked and separate from each other between said upper resistance heater and said lower resistance heater.

18. A substrate processing method as recited in claim 17, wherein said substrate processing is effected using a substrate processing apparatus which comprises:
a substrate supporting pedestal including an upper substrate supporting pedestal and a lower substrate supporting pedestal which are vertically stacked, each of said upper substrate supporting pedestal and said lower substrate supporting pedestal for mounting a substrate in a substantially horizontal position, and said lower substrate supporting pedestal including a first opening which exposes said substrate in its entirety as viewed from under the lower substrate supporting pedestal;
said upper resistance heater provided above said upper substrate supporting pedestal so as to be opposite to said upper substrate supporting pedestal; and
said lower resistance heater provided under said lower substrate supporting pedestal so as to be opposite to said lower substrate supporting pedestal.

19. A substrate processing method as recited in claim 17, wherein said substrate is a semiconductor wafer.

20. A substrate processing method as recited in claim 18, wherein said substrate is a semiconductor wafer.

* * * * *